United States Patent [19]

Du

[11] Patent Number: 5,568,099
[45] Date of Patent: Oct. 22, 1996

[54] HIGH FREQUENCY DIFFERENTIAL VCO WITH COMMON BIASED CLIPPER

[75] Inventor: He Du, Sunnyvale, Calif.

[73] Assignee: Cirrus Logic, Inc., Fremont, Calif.

[21] Appl. No.: 534,538

[22] Filed: Sep. 27, 1995

[51] Int. Cl.$^6$ ............................ H03B 5/24; H03L 7/099
[52] U.S. Cl. .................. 331/57; 331/186; 331/8; 331/34; 327/543; 330/261
[58] Field of Search ........................ 331/8, 34, 57, 331/111, 113 R, 116 FE, 175, 177 R, 185, 186; 327/274, 280, 543; 330/253, 261

[56] References Cited

U.S. PATENT DOCUMENTS

| | | | |
|---|---|---|---|
| 5,384,501 | 1/1995 | Koyama et al. | 330/253 X |
| 5,467,060 | 11/1995 | Miyashita | 331/57 X |
| 5,489,878 | 2/1996 | Gilbert | 331/57 |

*Primary Examiner*—David Mis
*Attorney, Agent, or Firm*—Majestic, Parsons, Siebert & Hsue

[57] ABSTRACT

A VCO includes a ring oscillator formed by connecting a plurality of voltage controlled inverting delay cells together, a biasing circuit for providing a bias voltage to each of the voltage controlled inverting delay cells, and a source-follower transistor for providing a control voltage to the biasing circuit and voltage controlled inverting delay cells. Each of the voltage controlled inverting delay cells includes a first and a second plurality of transistors which define two outputs of the voltage controlled inverting delay cell, and a clipper transistor connected between the two outputs to short them together whenever a difference between a bias voltage provided to a gate of the clipper transistor by the biasing circuit and a voltage on either one of the two outputs exceeds a threshold voltage of the clipper transistor. The biasing circuit includes a third plurality of transistors which are matched with corresponding ones of the first and second pluralities of transistors and the clipper transistor such that the bias voltage generated by the biasing circuit automatically changes so as to be substantially equal to voltages corresponding to a HIGH logic state on the two outputs of each voltage controlled inverting delay cell as the control voltage provided to the biasing circuit and each of the voltage controlled inverting delay cells changes.

20 Claims, 9 Drawing Sheets

HIGH FREQUENCY DIFFERENTIAL VCO WITH COMMON BIASED CLIPPER

BACKGROUND OF THE INVENTION

This invention relates in general to voltage controlled oscillators and in particular, to high frequency voltage controlled oscillators including a plurality of voltage controlled differential inverting delay cells forming a ring oscillator.

Applic. Ser. No. 08/169,150 of Zhongxuan Zhang, entitled "Improved Differential Amplifier and Variable Delay Stage for Use in a Voltage Controlled Oscillator," and which is incorporated herein by this reference, describes a differential amplifier useful as a delay cell in a ring oscillator of a voltage controlled oscillator. The differential amplifier includes a pair of clipper transistors coupled as a pair of diodes across its output nodes for limiting the voltage swing at its output nodes to a threshold voltage of the clipper transistors. By limiting the voltage swing at its output nodes, rather than allowing it to swing rail to rail as in prior art differential amplifiers, the frequency response of the differential amplifier is improved over such prior art differential amplifiers.

Applic. Ser. No. 08/455,311 of Zhongxuan Zhang and He Du, entitled "Voltage Controlled Oscillator including Voltage Controlled Delay Circuit with Power Supply Noise Isolation," and which is incorporated herein by this reference, describes a voltage controlled oscillator including a plurality of voltage controlled differential inverting delay cells, wherein a control voltage is provided to each of the voltage controlled differential inverting delay cells through a source-follower transistor having a drain electrode connected to a power supply, a gate electrode connected to the control voltage, and a source electrode connected to the voltage controlled differential inverting delay cell such that the source-follower transistor provides the control voltage to the voltage controlled differential inverting delay cell while effectively isolating the voltage controlled differential inverting delay cell from noise on the power supply line.

In certain applications such as in high speed peripheral controllers for computer systems, it is desirable to further enhance the performance and in particular, the frequency response of a voltage controlled oscillator used therein.

OBJECTS AND SUMMARY OF THE INVENTION

Accordingly, one object of the present invention is to provide a voltage controlled oscillator ("VCO") having a plurality of voltage controlled differential inverting delay cells forming a ring oscillator circuit which has a higher frequency response than prior art VCOs.

This and additional objects are accomplished by the various aspects of the present invention, wherein briefly stated, one aspect of the present invention is a voltage controlled oscillator circuit including a plurality of voltage controlled differential inverting delay cells connected together to form a ring oscillator, and a biasing circuit for providing a bias voltage to individual ones of the plurality of voltage controlled differential inverting delay cells, wherein individual ones of the voltage controlled differential inverting delay cells have a first and a second plurality of transistors connected to a control voltage, and a clipper transistor connected to the first and second pluralities of transistors.

The first and second pluralities of transistors define first and second outputs such that when generating first and second logic states respectively at the first and second outputs, each of the first plurality of transistors is turned on and each of the second plurality of transistors is turned off, and when generating the second and first logic states respectively at the first and second outputs, each of the second plurality of transistors is turned on and each of the first plurality of transistors is turned off.

The clipper transistor has a drain connected to the first output, and a source connected to the second output. The biasing circuit receives the control voltage and provides an input voltage or secondary control voltage to the gates of the clipper transistors of the individual ones of the plurality of voltage controlled differential inverting delay cells such that the voltage provided to the gate of each clipper transistor increases as the control voltage increases. Included in the biasing circuit is a third plurality of transistors, wherein each transistor of the third plurality of transistors forms a matched pair with a corresponding transistor of the first plurality of transistors or clipper transistor.

Another aspect of the present invention is a computer system comprising a host processor, and a peripheral controller including a voltage controlled oscillator including a plurality of voltage controlled differential inverting delay cells connected together to form a ring oscillator, and a biasing circuit for providing a bias voltage to individual ones of the plurality of voltage controlled differential inverting delay cells, wherein individual ones of the voltage controlled differential inverting delay cells have a first and a second plurality of transistors connected to a control voltage, and a clipper transistor connected to the first and second pluralities of transistors.

The first and second pluralities of transistors define first and second outputs such that when generating first and second logic states respectively at the first and second outputs, each of the first plurality of transistors is turned on and each of the second plurality of transistors is turned off, and when generating the second and first logic states respectively at the first and second outputs, each of the second plurality of transistors is turned on and each of the first plurality of transistors is turned off.

The clipper transistor has a drain connected to the first output, and a source connected to the second output. The biasing circuit receives the control voltage and provides an input voltage or secondary control voltage to the gates of the clipper transistors of the individual ones of the plurality of voltage controlled differential inverting delay cells such that the voltage provided to the gate of each clipper transistor increases as the control voltage increases. Included in the biasing circuit is a third plurality of transistors, wherein each transistor of the third plurality of transistors forms a matched pair with a corresponding transistor of the first plurality of transistors or clipper transistor.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
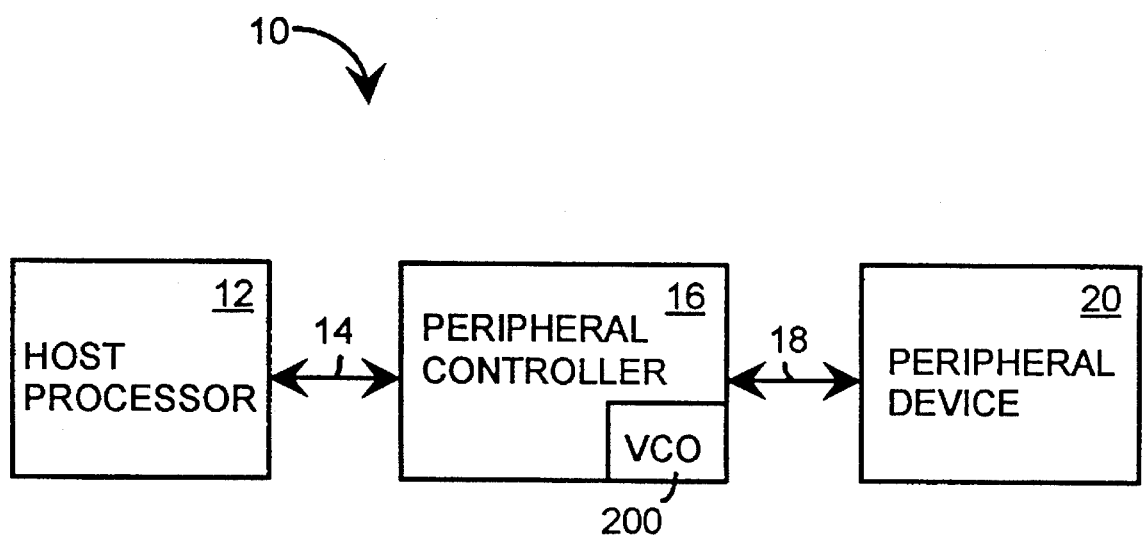
FIG. 1 illustrates, as an example, a block diagram of a computer system including a VCO utilizing aspects of the present invention.

FIG. 1 illustrates, as an example, a block diagram of a computer system 10 including a host processor 12, a peripheral controller 16, and a peripheral device 20. The host processor 12 is preferably one of a number of commercially available microprocessors such as those marketed by Intel and Motorola. The peripheral device 20 may be any one of a number of devices such as a disk drive, a CRT monitor, a modem, or the like. The peripheral controller 16 interfaces between the host processor 12 and the peripheral device 20 to free up the host processor 12 from having to perform certain peripheral device control functions. For example, the peripheral controller 16 may be a disk drive controller for controlling a disk drive, a graphics controller for controlling a CRT monitor, or a modem controller for controlling a modem. As part of the peripheral controller 16, a voltage controlled oscillator such as VCO 200 is often employed such as in a phase-locked loop circuit (not shown) performing any one of a number of functions such as clock signal synthesis, clock signal aligning, or clock signal recovery.

Figure 2:
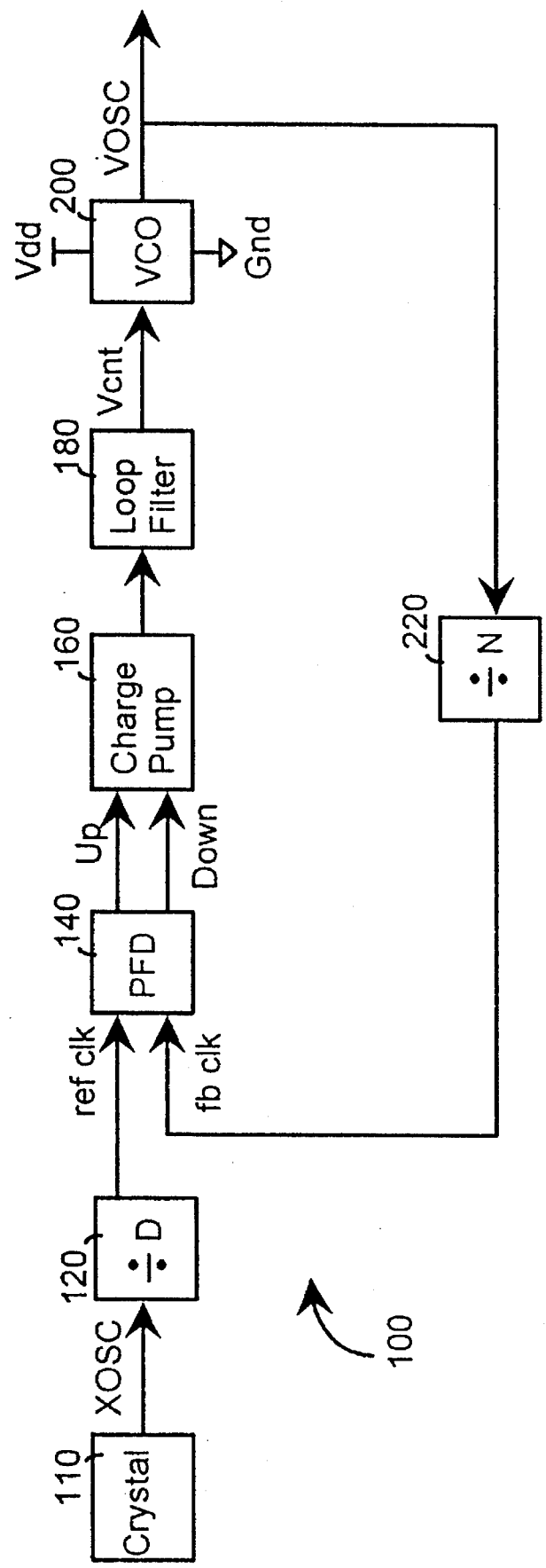
FIG. 2 illustrates, as an example, a block diagram of a PLL including a VCO utilizing aspects of the present invention.

VCOs are particularly useful in phase-locked loop circuits ("PLLs") such as PLL 100 in FIG. 2. The PLL 100 locks the phase of an output clock signal VOSC generated by a VCO 200, to that of an input clock signal XOSC generated by a crystal oscillator circuit 110. In general, it does this by comparing the respective phases of the two clock signals and adjusting a control voltage Vcnt to the VCO 200 accordingly. In particular, a reference signal "ref clk", generated by providing the input clock signal XOSC to a divide-by-D circuit 120, is connected to a first input of a phase/frequency detector ("PFD") 140, and a feedback signal "fb clk", generated by providing the output clock signal VOSC to a divide-by-N circuit 220, is connected to a second input of the PFD 140. Depending upon whether the phase of the feedback signal "fb clk" leads or lags that of the reference signal "ref clk", the PFD 140 activates either an up or down signal to a charge pump circuit 160. The charge pump circuit 160 thereupon generates the control voltage Vcnt by either charging up in response to the up signal being activated by the PFD 140, or discharging down in response to the down signal being activated by the PFD 140. The loop filter 180 is placed in the forward path of the PLL 100 to provide stability.

Figure 3:
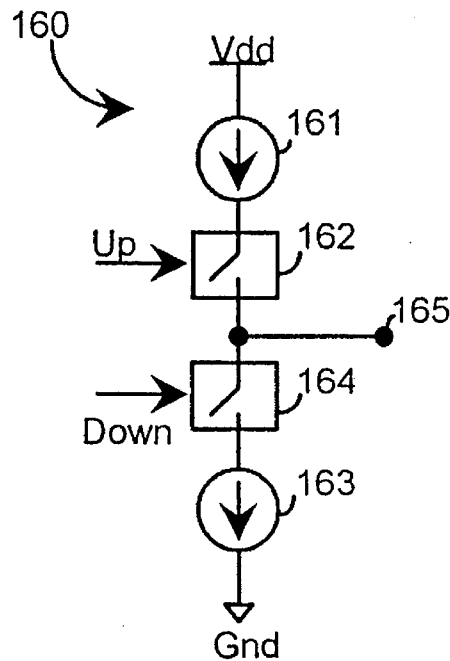
FIGS. 3 and 4 respectively illustrate, as examples, circuit schematics for a charge pump circuit useful for the PLL of FIG. 2, and a loop filter circuit useful for the PLL of FIG. 2.
Figure 4:
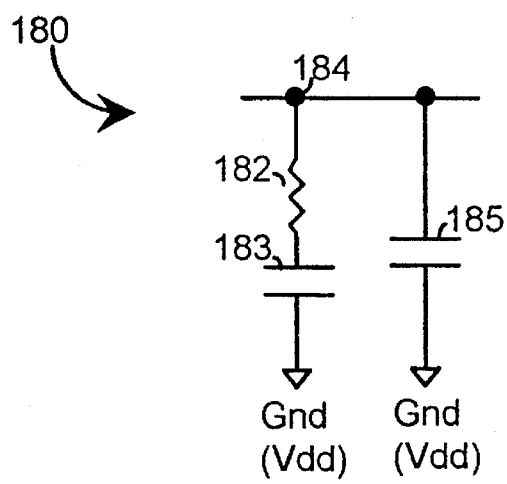

FIGS. 3 and 4 respectively illustrate, as examples, simplified circuits for the charge pump 160 and the loop filter 180 of the PLL 100. The charge pump circuit 160 includes matched current sources 161 and 163, and switches 162 and 164 respectively responsive to the up and down signals from the PFD 140. When the up signal is activated (and the down signal is deactivated), the switch 162 closes, thus charging up the voltage on node 165. On the other hand, when the down signal is activated (and the up signal is deactivated), the switch 164 closes, thus discharging the voltage on node 165. The loop filter 180 preferably includes a series connected resistor 182 and capacitor 183 which are in turn, connected in parallel with a second capacitor 185 to form a second-order filter. Node 184 of the loop filter 180 is connected to node 165 of the charge pump 160 to provide the control voltage Vcnt. When providing the control voltage Vcnt to the gate of an n-mos transistor source follower such as included in the VCO 200 of FIG. 5, for example, the capacitors 183 and 185 are preferably connected to the low voltage reference Gnd (as indicated without parentheses), and when providing the control voltage Vcnt to the gate of a p-mos transistor source-follower such as included in the VCO 200' of FIG. 6, the capacitors 183 and 185 are preferably connected to the high voltage reference Vdd (as indicated within parentheses). The respective values for the resistor 182, capacitor 183 and capacitor 185 are selected to ensure stability of the PLL 100. This may be done through conventional simulation or prototyping techniques.

Figure 5:
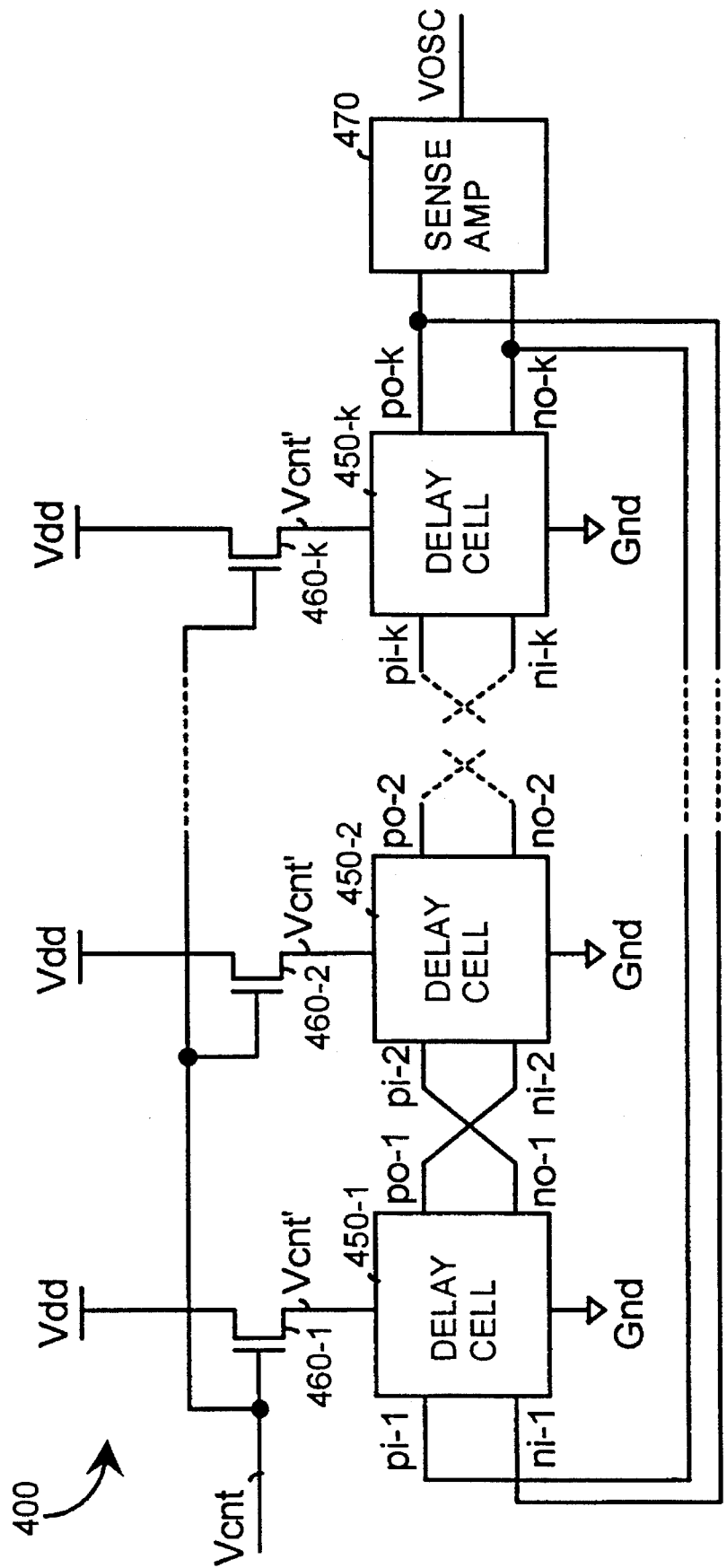
FIGS. 5 and 6 illustrate, as examples, block diagrams of prior art VCOs useful for the PLL of FIG. 2.

FIG. 5 illustrates, as an example, a block diagram of a prior art VCO 400 used as the VCO 200 of FIG. 2. The VCO 400 includes a plurality of voltage controlled differential inverting delay cells, 450-1 to 450-k, (also referred to herein as "voltage controlled delay cells" or "voltage controlled differential delay cells") connected together to form a k-stage ring oscillator, and preferably, a plurality of n-mos transistors, 460-1 to 460-k, operating in saturated conducting states and acting as source-followers to provide an input voltage Vcnt' to each of the plurality of voltage controlled differential inverting delay cells, 450-1 to 450-k, while isolating the plurality of voltage controlled differential inverting delay cells, 450-1 to 450-k, from power supply noise. The drains of the plurality of n-mos transistors, 460-1 to 460-k, are each connected to a high voltage end Vdd of a power supply, the gates of the plurality of n-mos transistors, 460-1 to 460-k, are each connected to the control voltage Vcnt, and the sources of the plurality of n-mos transistors, 460-1 to 460-k, are each connected to a corresponding one of the plurality of voltage controlled differential inverting delay cells, 450-1 to 450-k.

Each of the voltage controlled differential inverting delay cells, 450-1 to 450-k, has two inputs and two outputs. A first signal entering a first input designated a positive input pi-k for the kth voltage controlled delay cell 450-k causes an inverted signal to be generated at a first output designated a negative output no-k for the kth voltage controlled delay cell 450-k, after a delay determined by the magnitude of the input voltage Vcnt' provided to the kth voltage controlled delay cell 450-k. Similarly, a second signal (generally representing an opposite logic state than the first signal) entering a second input designated a negative input ni-k for the kth voltage controlled delay cell 450-k causes an inverted signal to be generated at a second output designated as a positive output po-k for the kth voltage controlled delay cell 450-k, after a delay substantially the same as the first signal's for a same magnitude of the control voltage Vcnt provided to the kth voltage controlled delay cell 450-k.

For an odd number of the plurality of voltage controlled differential inverting delay cells, 450-1 to 450-k, the k-stage ring oscillator is formed as shown in FIG. 5 by connecting a positive output of each one of the voltage controlled differential inverting delay cells, 450-1 to 450-k, to a negative input of another one of the voltage controlled differential inverting delay cells, 450-1 to 450-k, and a negative output of each one of the voltage controlled differential inverting delay cells, 450-1 to 450-k, to a positive input of another one of the voltage controlled differential inverting delay cells, 450-1 to 450-k, in such a fashion that the plurality of voltage controlled differential inverting delay cells, 450-1 to 450-k, form a ring structure as shown in FIG. 5. For example, a positive output po-1 of a first voltage controlled differential inverting delay cell 450-1 is connected to a negative input ni-2 of a second voltage controlled differential inverting delay cell 450-2, and a negative output no-1 of the first voltage controlled differential inverting delay cell is connected to a positive input pi-2 of the second voltage controlled differential inverting delay cell 450-2, and so on, until a positive output po-k of a kth voltage controlled differential inverting delay cell 450-k is connected back to a negative input ni-1 of the first voltage controlled differential inverting delay cell 450-1, and a negative output no-k of the kth voltage controlled differential inverting delay cell 450-k is connected back to a positive input pi-1 of the first voltage controlled differential inverting delay cell 450-1. Thereupon, by varying the input voltage Vcnt' provided to each of the plurality of voltage controlled differential inverting delay cells, 450-1 to 450-k, respective time delays in generating a pair of output signals corresponding to the pair of signals entering each of the plurality of voltage controlled differential inverting delay cells, 450-1 to 450-k, are correspondingly varied, and as a result, the period of oscillation of the VCO 400 is correspondingly varied (as evidenced, for example, on a signal VOSC sensed through a sense amplifier 470 generated at the positive and negative outputs, po-k and no-k, of the kth voltage controlled delay cell 450-k).

For an even number of the plurality of voltage controlled differential inverting delay cells, 450-1 to 450-k, the k-stage ring oscillator is formed as a slight modification of the k-stage ring oscillator shown in FIG. 5. In the connections between two of the voltage controlled differential inverting delay cells, 450-1 to 450-k, the connections are different than those between other twos of the voltage controlled differential inverting delay cells, 450-1 to 450-k. In the different connection, a positive output of one of the two voltage controlled differential inverting delay cells is connected to a positive input of the other of the two voltage controlled differential inverting delay cells, 450-1 to 450-k, and a negative output of the one of the two voltage controlled differential inverting delay cells, 450-1 to 450-k, is connected to a negative input of the other of the two voltage controlled differential inverting delay cells, 450-1 to 450-k. All other connections between the odd number of the plurality of voltage controlled differential inverting delay cells, 450-1 to 450-k, are made in the same manner as described in reference to the ring oscillator shown in FIG. 5.

Figure 6:
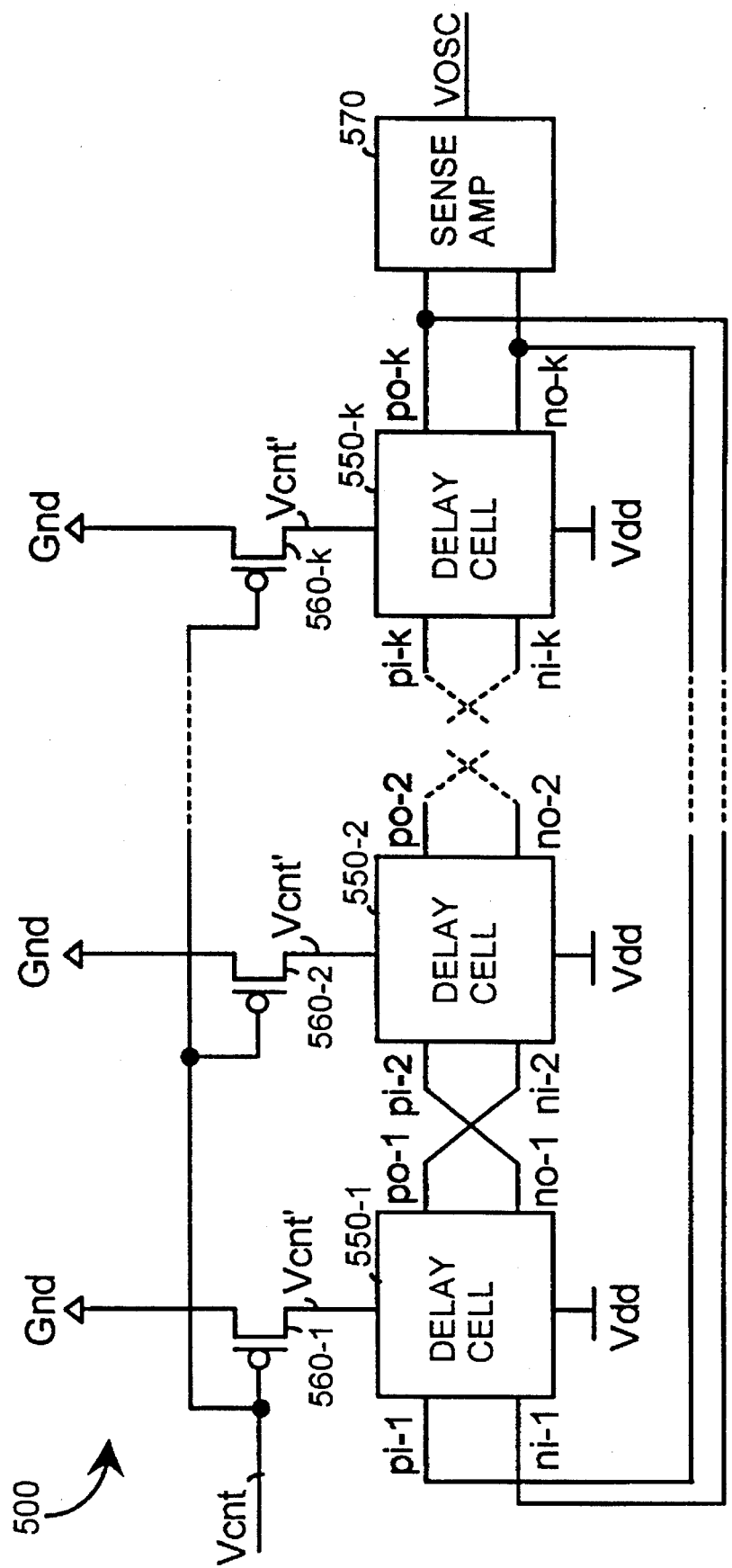

FIG. 6 illustrates, as an example, a block diagram of another prior art VCO 500 used for the VCO 200 in the PLL 100 of FIG. 2. The VCO 500 includes a plurality of voltage controlled differential inverting delay cells, 550-1 to 550-k, (also referred to herein as "voltage controlled delay cells" or "voltage controlled differential delay cells") connected together to form a k-stage ring oscillator, and preferably, a plurality of p-mos transistors, 560-1 to 560-k, operating in saturated conducting states and acting as source-followers to provide an input voltage Vcnt' to each of the plurality of voltage controlled differential inverting delay cells, 550-1 to 550-k, while isolating the plurality of voltage controlled differential inverting delay cells, 550-1 to 550-k, from power supply noise. The drains of the plurality of p-mos transistors, 560-1 to 560-k, are each connected to a low voltage end Gnd of a power supply, the gates of the plurality of p-mos transistors, 560-1 to 560-k, are each connected to the control voltage Vcnt, and the sources of the plurality of p-mos transistors, 560-1 to 560-k, are each connected to a corresponding one of the plurality of voltage controlled differential inverting delay cells, 550-1 to 550-k.

Each of the voltage controlled differential inverting delay cells, 550-1 to 550-k, has two inputs and two outputs, and functions in a similar manner as described in reference to each of the voltage controlled differential inverting delay cells, 450-1 to 450-k of the VCO 400. In addition, the k-stage ring oscillator of the VCO 500 is also formed in a similar manner as described in reference to the k-stage ring oscillator of the VCO 400.

Figure 7:
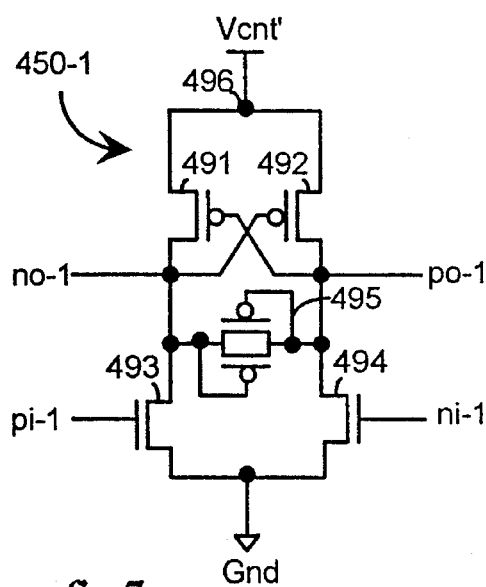
FIGS. 7 and 8 illustrate, as examples, circuit schematics of prior art differential delay cells useful for the prior art VCO of FIG. 5.
Figure 8:
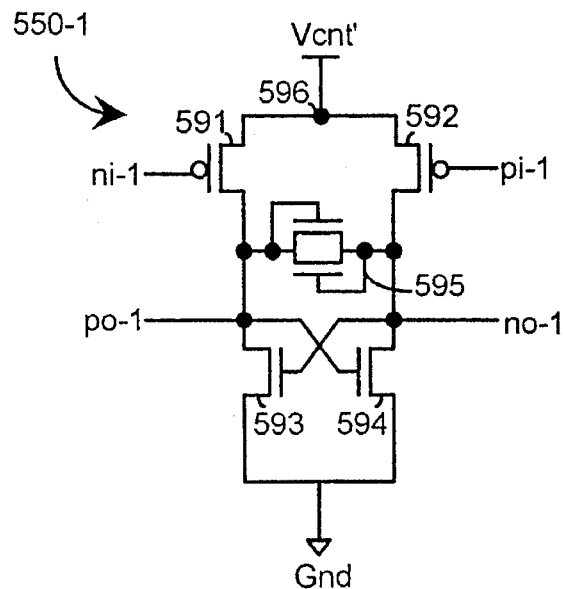
Figure 9:
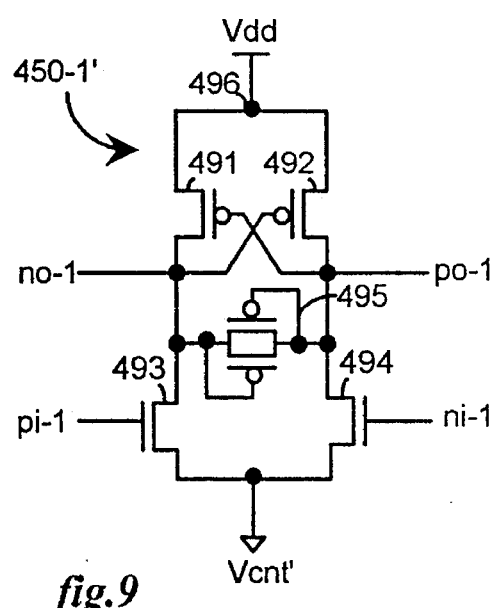
FIGS. 9 and 10 illustrate, as examples, circuit schematics of prior art differential delay cells useful for the prior art VCO of FIG. 6.
Figure 10:
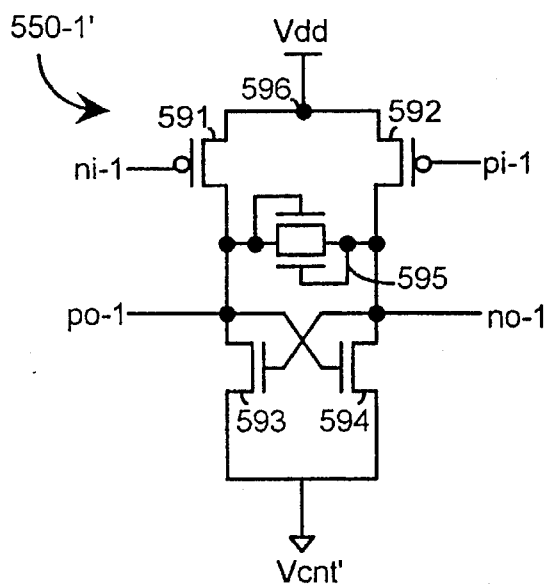

FIGS. 7 and 8 respectively illustrate, as examples, prior art voltage controlled differential inverting delay cells, 450-1 and 450-1', useful for the VCO 400 of FIG. 5 when connected between the input voltage Vcnt' and the low reference voltage Gnd, and FIGS. 9 and 10 respectively illustrate, as examples, prior art voltage controlled differential inverting delay cells, 550-1 and 550-1', used for the VCO 500 of FIG. 6 when connected between the high reference voltage Vdd and the input voltage Vcnt'.

In FIG. 7, a first prior art voltage controlled differential inverting delay cell 450-1 useful for the VCO 400 of FIG. 5, includes p-mos transistors 491 and 492 having sources connected at node 496 to the input voltage Vcnt', and gates wherein the gate of p-mos transistor 491 is connected to a drain of p-mos transistor 492 and the gate of p-mos transistor 492 is connected to a drain of p-mos transistor 491; and n-mos transistors 493 and 494 having sources connected to a low reference voltage Gnd, gates respectively acting as the positive and negative inputs pi-1 and ni-1 of the voltage controlled differential inverting delay cell 450-1-3, and drains respectively connected to the drains of the p-mos transistors 491 and 492 to form at such connections negative and positive outputs no-1 and po-1 of the voltage controlled differential inverting delay cell 450-1.

A pair 495 of output clipping diodes is also preferably connected between the positive and negative outputs po-1 and no-1 of the voltage controlled delay cell 450-1. As shown in FIG. 7, the pair 495 of output clipping diodes is formed, for example, of a first p-mos transistor having its drain and gate connected to the positive output po-1 of the voltage controlled differential inverting delay cell 450-1, and its source connected to the negative output no-1 of the voltage controlled differential inverting delay cell 450-1, and a second p-mos transistor having its drain and gate connected to the negative output no-1 of the voltage controlled differential inverting delay cell 450-1, and its source connected to the positive output po-1 of the voltage controlled differential inverting delay cell 450-1. Accordingly, since each p-mos transistor of the pair 495 of clipper diodes turns on when its source voltage Vs is greater than its gate voltage Vg by the absolute value of its threshold voltage vth (i.e., Vgs<Vth or Vg−Vth<Vs, where Vth equals, for example, −0.7 volts), the first p-mos transistor turns on when the negative output no-1 connected to its source becomes greater by the absolute value of the threshold voltage Vth, than the positive output po-1 connected to its gate, and the second p-mos transistor turns on when the positive output po-1 connected to its source becomes greater by the absolute value of the threshold voltage Vth, than the negative output no-1 connected to its gate. As would be readily apparent to those skilled in the art, replacing the first and second p-mos transistors of the pair 495 of clipper diodes with first and second n-mos transistors identically connected, would also accomplish the same function is a similar manner.

In FIG. 9, the first prior art voltage controlled differential inverting delay cell 450-1 is shown connected such that it is useful for the VCO 500 of FIG. 6. In particular, the sources of the p-mos transistors 491 and 492 are connected to a high reference voltage Vdd, the sources of the n-mos transistors 493 and 494 are connected to the input voltage Vcnt', and all other connections between the p-mos transistors 491 and 492, and the n-mos transistors 493 and 494 are substantially the same as described in reference to their like numbered counterparts in FIG. 7.

In FIG. 8, a second prior art voltage controlled differential inverting delay cell 550-1 useful for the VCO 400 of FIG. 5, includes p-mos transistors 591 and 592 having sources connected at node 596 to the input voltage Vcnt', and gates respectively acting as the negative and positive inputs ni-1 and pi-1 of the voltage controlled differential inverting delay cell 550-1; and n-mos transistors 593 and 594 having sources connected to a low reference voltage Gnd, gates wherein the gate of n-mos transistor 593 is connected to a drain of n-mos transistor 594 and the gate of n-mos transistor 594 is connected to a drain of n-mos transistor 593, and drains respectively connected to the drains of the p-mos transistors 591 and 592 and to form at such connections positive and negative outputs po-1 and no-1 of the voltage controlled differential inverting delay cell 550-1. A pair 595 of output clipping diodes is also preferably connected between the positive and negative outputs po-1 and no-1 of the voltage controlled delay cell 550-1, in a similar fashion to the pair 495 of output clipping diodes as described in reference to FIG. 7.

In FIG. 10, the second prior art voltage controlled differential inverting delay cell 550-1 is connected such that it is useful for the VCO 500 of FIG. 6. In particular, the sources of the p-mos transistors 591 and 592 are connected to a high reference voltage Vdd, and the sources of the n-mos transistors 593 and 594 are to the input voltage Vcnt'. All other connections between the p-mos transistors 591 and 592, and the n-mos transistors 593 and 594 are substantially the same as described in reference to their like numbered counterparts as in FIG. 8.

Figure 11:
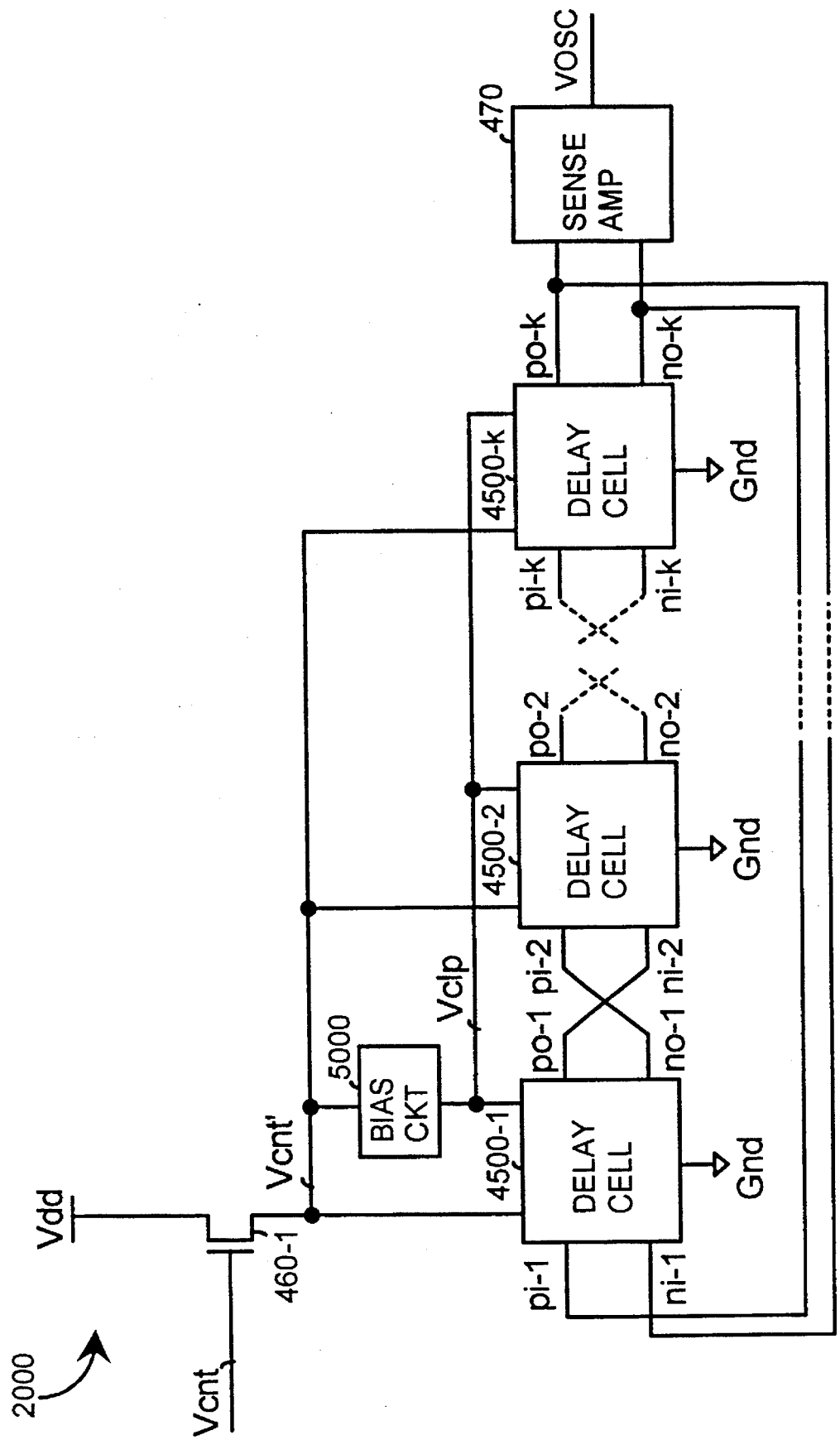
FIGS. 11 and 12 illustrate, as examples, block diagrams of VCOs utilizing aspects of the present invention, which are useful for the PLL of FIG. 2.
Figure 12:
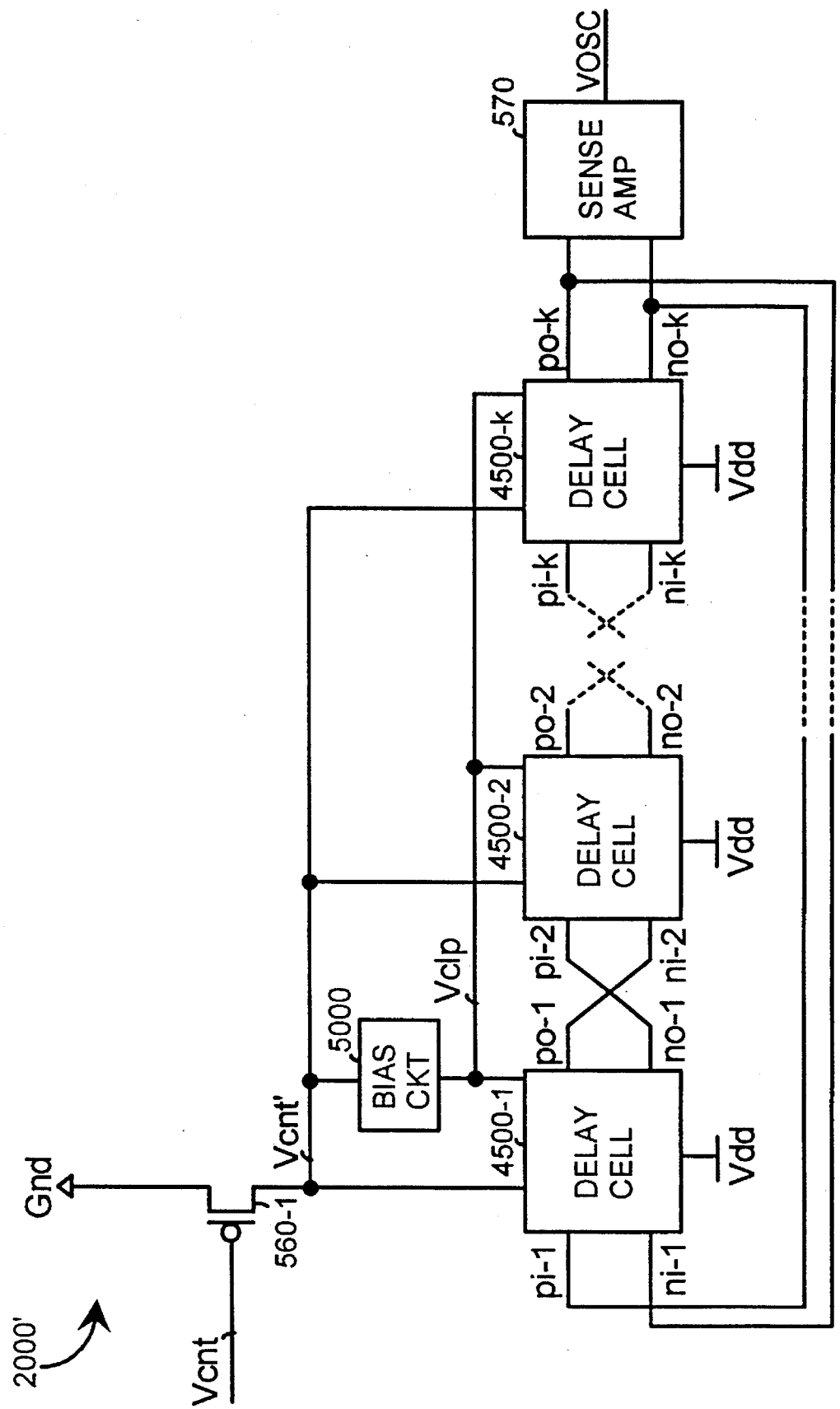
Figure 13:
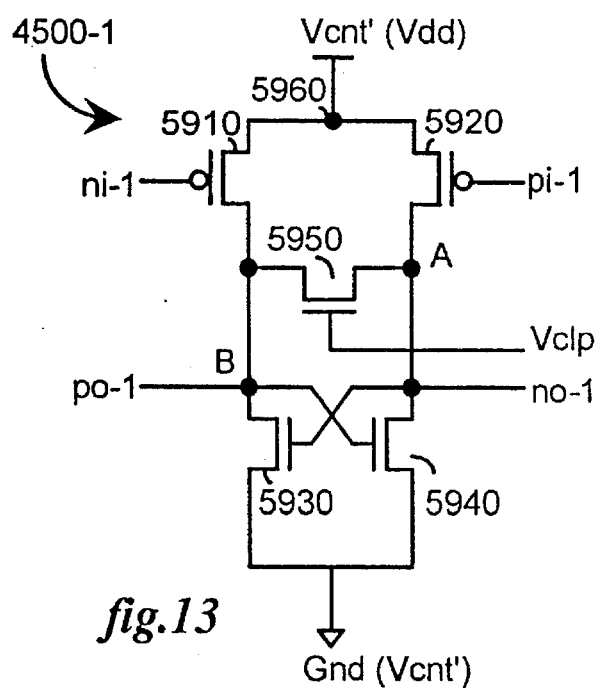
FIGS. 13 and 14 respectively illustrate, as examples, circuit schematics for a voltage controlled differential delay cell and corresponding biasing circuit useful for the VCOs of FIGS. 11 and 12, and utilizing aspects of the present invention.
Figure 14:
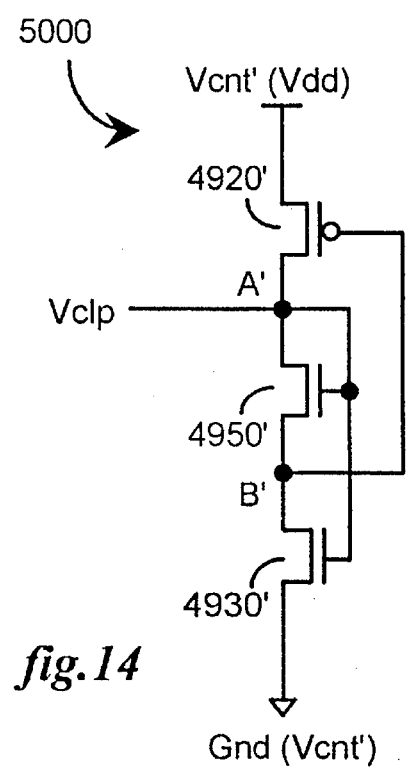
Figure 15:
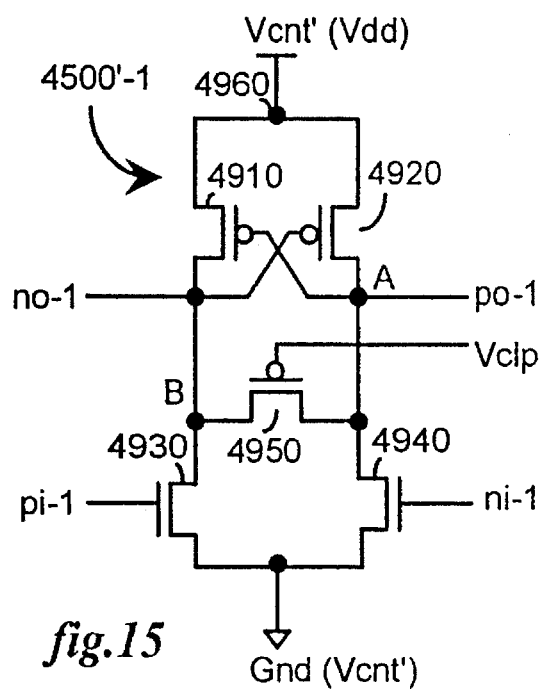
FIGS. 15 and 16 respectively illustrate, as examples, circuit schematics for another voltage controlled differential delay cell and corresponding biasing circuit useful for the VCOs of FIGS. 11 and 12, and utilizing aspects of the present invention.
Figure 16:
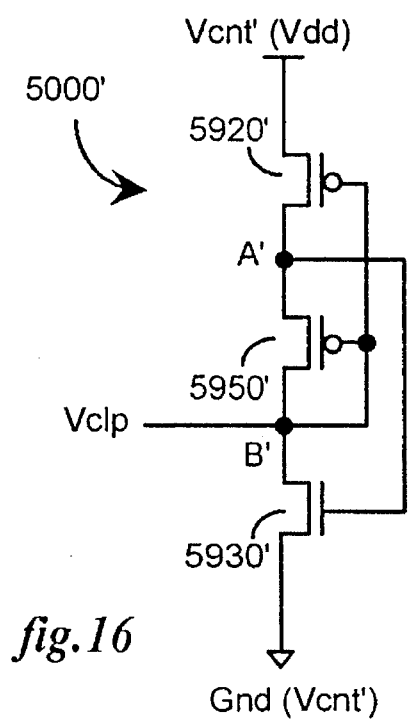

FIGS. 11 and 12 illustrate, as examples, block diagrams of two voltage controlled oscillators, 2000 and 2000', which are useful as the VCO 200 of the PLL 100 in FIG. 2; FIGS. 13 and 15 illustrate, as examples, circuit schematics of voltage controlled differential inverting delay cells, 4500-1 and 4500'-1, respectively, which are useful in forming the ring oscillators of the voltage controlled oscillators, 2000 and 2000', respectively in FIGS. 11 and 12; and FIGS. 14 and 16 illustrate, as examples, circuit schematics of biasing circuits, 5000 and 5000', respectively, which are useful for biasing the voltage controlled differential inverting delay cells, 4500-1 and 4500'-1, respectively in FIGS. 13 and 15.

Referring to FIG. 13, the voltage controlled differential inverting delay cell 4500-1 includes p-mos transistors 5910 and 5920 having sources connected at a power node 5960 to the input voltage Vcnt' when employed in the voltage controlled oscillator 2000 in FIG. 11 or, as indicated in parentheses, to a high reference voltage Vdd when employed in the voltage controlled oscillator 2000' in FIG. 12, and gates respectively acting as the negative and positive inputs ni-1 and pi-1 of the voltage controlled differential inverting delay cell 4500-1, wherein the terms "negative" and "positive" generally refer to the logic states of the outputs, not to the polarities of the input voltages. Preferably, the p-mos transistors, 5910 and 5920, are substantially identically constructed to have the same operating characteristics (i.e., they are "matched" transistors).

The voltage controlled differential inverting delay cell 4500-1 also includes cross-coupled n-mos transistors 5930 and 5940 having sources connected to a low reference voltage Gnd when employed in the voltage controlled oscillator 2000 in FIG. 11 or, as indicated in parentheses, to the input voltage Vcnt' when employed in the voltage controlled oscillator 2000' in FIG. 12, and drains respectively connected to the drains of the p-mos transistors 5910 and 5920, to form at such connections, the positive and negative outputs po-1 and no-1 of the voltage controlled differential inverting delay cell 4500-1, wherein the terms "negative" and "positive" generally refer to the logic states of the outputs, not to the polarities of the output voltages (e.g., when a low input voltage is provided at the negative input ni-1 and a high input voltage is provided at the positive input pi-1, a LOW logic state results at the negative output no-1 and a HIGH logic state results at the positive output po-1, and conversely, when a high input voltage is provided at the negative input ni-1 and a low input voltage is provided at the positive input pi-1, a HIGH logic state results at the negative output no-1 and a LOW logic state results at the positive output po-1). The cross-coupled n-mos transistors, 5930 and 5940, also respectively have gates, wherein the gate of n-mos transistor 5930 is connected to the drain of the n-mos transistor 5940 and the gate of the n-mos transistor 5940 is connected to the drain of the n-mos transistor 5930. Preferably, the n-mos transistors, 5930 and 5940, are substantially identically constructed to have the same operating characteristics (i.e., they are "matched" transistors).

An n-mos clipper transistor 5950 is connected between the positive and negative outputs po-1 and no-1 of the voltage controlled differential inverting delay cell 4500-1 to clip the outputs to a voltage. The clipper transistor 5950 has a drain connected, for example, to the positive output po-1, and a source connected to the negative output no-1 of the voltage controlled differential inverting delay cell 4500-1. A bias voltage Vclp is applied to a gate of the clipper transistor 5950 so that the n-mos clipper transistor 5950 turns on whenever either the positive output po-1 connected to its drain or the negative output no-1 connected to its source becomes less than the difference between the bias voltage Vclp and a threshold voltage Vth of the clipper transistor 5950 (i.e., Vgs>Vth or Vg–Vth>Vs, where Vth equals, for example, 0.7 volts), thus effectively "clipping" the output voltage corresponding to a HIGH logic state at that point.

By employing a clipper transistor such as 5950 in FIG. 13, instead of a pair of clipper diodes such as 595 in FIG. 8, in each of the voltage controlled differential inverting delay cells, 4500-1 to 4500-k, of the VCO 2000 in FIG. 11 and the VCO 2000' in FIG. 12, the resulting frequency responses of the VCO 2000 in FIG. 11 and the VCO 2000' in FIG. 12 are significantly greater since the output loading of each of the voltage controlled differential inverting delay cells, 4500-1 to 4500-k, is correspondingly less than their counterparts in the VCO 400 in FIG. 5 and the VCO 500 in FIG. 6. For example, simulations indicate that a VCO resembling the VCO 2000 in FIG. 11 (i.e., having a clipper transistor such as 5950 in each of the voltage controlled differential inverting delay cells, 4500-1 to 4500-k) has approximately twice the frequency response of a VCO resembling the VCO 400 in FIG. 5 (i.e., having a pair of clipper diodes such as 595 in each of the voltage controlled differential delay cells, 450-1 to 450-k).

FIG. 14 illustrates, as an example, a biasing circuit 5000 suitable for providing the bias voltage Vclp to the voltage controlled differential inverting delay cell 4500-1. The biasing circuit 5000 includes a p-mos transistor 4920' having a source connected to the input voltage Vcnt' when employed in conjunction with the VCO 2000 in FIG. 11 or, as indicated in parentheses, to a high reference voltage Vdd when employed in conjunction with the VCO 2000' in FIG. 12; an n-mos transistor 4950' having a drain connected to a drain of the p-mos transistor 4920' to provide at that point, the bias voltage Vclp; and an n-mos transistor 4930' having a drain connected to the source of the n-mos transistor 4950' and to a gate of the p-mos transistor 4920', a gate connected to a gate of the n-mos transistor 4950' and to the connected together drains of the p-mos transistor 4920' and the n-mos transistor 4950', and a source connected to a low reference voltage Gnd when employed in conjunction with the VCO 2000 in FIG. 11 or, as indicated in parentheses, to the input voltage Vcnt' when employed in conjunction with the VCO 2000' in FIG. 12. As a result of such connections as shown in FIG. 14, the p-mos transistor 4920', and the n-mos transistors, 4950' and 4930', are each turned on. For example, node A' being at a higher voltage level than node B', tends to turn on n-mos transistors, 4950' and 4930', and node B' being at a lower voltage level than node A', tends to turn on p-mos transistor 4920'. In addition, the bias voltage Vclp provided at node A', increases proportionally as the input voltage Vcnt' increases.

Preferably, the p-mos transistor 4920' of the biasing circuit 5000 is substantially identically constructed as the p-mos transistors 5920 and 5910 of the voltage controlled differential inverting delay cell 4500-1 so that it substantially has the same operating characteristics as the p-mos transistors 5920 and 5910 (i.e., they are "matched" transistors), the n-mos transistor 4950' of the biasing circuit 5000 is substantially identically constructed as the n-mos clipper transistor 5950 of the voltage controlled differential inverting delay cell 4500-1 so that it substantially has the same operating characteristics as the n-mos clipper transistor 5950 (i.e., they are "matched" transistors), and the n-mos transistor 4930' of the biasing circuit 5000 is substantially identically constructed as the n-mos transistors 5930 and 5940 of the voltage controlled differential inverting delay cell 4500-1 so that it substantially has the same operating characteristics as the n-mos transistors 5930 and 5940 (i.e., they are "matched" transistors). As a result of such matching, the bias voltage Vclp provided to the gate of the clipper transistor 5950 closely tracks the output of the voltage controlled differential inverting delay cell 4500-1 corresponding to a HIGH logic state. For example, when the negative output no-1 is at a HIGH logic state and the positive output po-1 is at a LOW logic state, p-mos transistor 5920, n-mos transistor 5950, and n-mos transistor 5930 of the voltage controlled differential inverting delay cell 4500-1 are turned on, and with the biasing circuit 5000 providing the bias voltage Vclp to the gate of the clipper transistor 5950 of the voltage controlled differential inverting delay cell 4500-1, the voltage at node A of the voltage controlled differential inverting delay cell 4500-1 is substantially equal to the voltage at node A' of the biasing circuit 5000, and the voltage at node B of the voltage controlled differential inverting delay cell 4500-1 is substantially equal to the voltage at node B' of the biasing circuit 5000. As a consequence, operation of the voltage controlled differential inverting delay cell 4500-1 is substantially the same as that of the prior art voltage controlled differential inverting delay cell 450-1', while the output loading of the voltage controlled differential inverting delay cell 4500-1 is substantially less than that of the prior art voltage controlled differential inverting delay cell 450-1' and as a consequence, a VCO such as VCO 2000 in FIG. 11 or VCO 2000' in FIG. 12, employing such voltage controlled differential inverting delay cells as the voltage controlled differential inverting delay cell 4500-1 may operate at a significantly higher frequency than a VCO such as VCO 400 in FIG. 5 or VCO 500 in FIG. 6, employing such voltage controlled differential inverting delay cells as the prior art voltage controlled differential inverting delay cell 450-1'.

Referring to FIG. 15, the voltage controlled differential inverting delay cell 4500'-1 includes n-mos transistors 4940 and 4930 having sources connected to a low reference voltage Gnd when employed in the voltage controlled oscillator 2000 in FIG. 11 or, as indicated in parentheses, to the control voltage Vcnt' when employed in the voltage controlled oscillator 2000' in FIG. 12, and gates respectively acting as the negative and positive inputs ni-1 and pi-1 of the voltage controlled differential inverting delay cell 4500'-1, wherein the terms "negative" and "positive" generally refer to the logic states of the outputs, not to the polarities of the input voltages. Preferably, the n-mos transistors, 4940 and 4930, are substantially identically constructed to have the same operating characteristics (i.e., they are "matched" transistors).

The voltage controlled differential inverting delay cell 4500'-1 also includes cross-coupled p-mos transistors 4910 and 4920 having sources connected to the control voltage Vcnt' when employed in the voltage controlled oscillator 2000 in FIG. 11 or, as indicated in parentheses, to a high reference voltage Vdd when employed in the voltage controlled oscillator 200' in FIG. 12, and drains respectively connected to the drains of the n-mos transistors 4930 and 4940, to form at such connections, the negative and positive outputs no-1 and po-1 of the voltage controlled differential inverting delay cell 4500'-1, wherein the terms "negative" and "positive" generally refer to the logic states of the outputs, not to the polarities of the output voltages (e.g., when a low input voltage is provided at the negative input ni-1 and a high input voltage is provided at the positive input pi-1, a LOW logic state results at the negative output no-1 and a HIGH logic state results at the positive output po-1, and conversely, when a high input voltage is provided at the negative input ni-1 and a low input voltage is provided at the positive input pi-1, a HIGH logic state results at the negative output no-1 and a LOW logic state results at the positive output po-1). The cross-coupled p-mos transistors, 4910 and 4920, also respectively have gates, wherein the gate of p-mos transistor 4910 is connected to the drain of the p-mos transistor 4920 and the gate of the p-mos transistor 4920 is connected to the drain of the p-mos transistor 4910. Preferably, the p-mos transistors, 4910 and 4920, are substantially identically constructed to have the same operating characteristics (i.e., they are "matched" transistors).

A p-mos clipper transistor 4950 is connected between the positive and negative outputs po-1 and no-1 of the voltage controlled differential inverting delay cell 4500'-1 to clip the outputs to a predetermined voltage. The clipper transistor 4950 has a drain connected, for example, to the positive output po-1, and a source connected to the negative output no-1 of the voltage controlled differential inverting delay cell 4500'-1. A bias voltage Vclp is applied to a gate of the clipper transistor 4950 so that the p-mos clipper transistor 4950 turns on whenever either the positive output po-1 connected to its drain or the negative output no-1 connected to its source becomes greater than the difference between the bias voltage Vclp and a threshold voltage Vth of the clipper transistor 5950 (i.e., Vgs<Vth or Vg–Vth<Vs, where Vth equals, for example, –0.7 volts), thus effectively "clipping" the output voltage corresponding to a HIGH logic state at that point. The advantages of employing such the p-mos clipper transistor 4950 are substantially the same as those of employing the n-mos clipper transistor 5950 in the voltage controlled differential inverting delay cell 4500-1. Also, those skilled in the art would readily appreciate that a p-mos clipper transistor instead of the n-mos clipper transistor 5950 may have been used in the voltage controlled differential inverting delay cell 4500-1, and an n-mos clipper transistor instead of the p-mos clipper transistor 4950 may have been used in the voltage controlled differential inverting delay cell 4500'-1.

FIG. 16 illustrates, as an example, a biasing circuit 5000' suitable for providing the bias voltage Vclp to the voltage controlled differential inverting delay cell 4500'-1. The biasing circuit 5000' includes a n-mos transistor 5930' having a source connected to the low reference voltage Gnd when employed in conjunction with the VCO 2000 in FIG. 11 or, as indicated in parentheses, to the control voltage Vcnt' when employed in conjunction with the VCO 2000' in FIG. 12; a p-mos transistor 5950' having a drain connected to a drain of the n-mos transistor 5930' to provide at that point, the bias voltage Vclp; and a p-mos transistor 5920' having a drain connected to the source of the p-mos transistor 5950' and to a gate of the n-mos transistor 5930', a gate connected to a gate of the p-mos transistor 5950' and to the connected together drains of the n-mos transistor 5930' and the p-mos transistor 5950', and a source connected to the control voltage Vcnt' when employed in conjunction with the VCO 2000 in FIG. 11 or, as indicated in parentheses, to the high reference voltage Vdd when employed in conjunction with the VCO 2000' in FIG. 12. As a result of such connections as shown in FIG. 16, the n-mos transistor 5930', and the p-mos transistors, 5950' and 5920', are each turned on. For example, node A' being at a higher voltage level than node B', tends to turn on n-mos transistor 5930', and node B' being at a lower voltage level than node A', tends to turn on p-mos transistors 5920' and 5950'. In addition, the bias voltage Vclp provided at node B', increases proportionally as the input voltage Vcnt' increases.

Preferably, the n-mos transistor 5930' of the biasing circuit 5000' is substantially identically constructed as the n-mos transistors 4930 and 4940 of the voltage controlled differential inverting delay cell 4500'-1 so that it substantially has the same operating characteristics as the n-mos transistors 4930 and 4940 (i.e., they are "matched" transistors), the p-mos transistor 5950' of the biasing circuit 5000' is substantially identically constructed as the p-mos clipper transistor 4950 of the voltage controlled differential inverting delay cell 4500'-1 so that it substantially has the same operating characteristics as the p-mos clipper transistor 4950 (i.e., they are "matched" transistors), and the p-mos transistor 5920' of the biasing circuit 5000' is substantially identically constructed as the p-mos transistors 4910 and 4920 of the voltage controlled differential inverting delay cell 4500'-1 so that it substantially has the same operating characteristics as the p-mos transistors 4910 and 4920 (i.e., they are "matched" transistors). As a result of such matching, the bias voltage vclp provided to the gate of the clipper transistor 4950 closely tracks the output corresponding to a LOW logic state of the voltage controlled differential inverting delay cell 4500'-1 in a similar manner as the bias voltage provided to the gate of the clipper transistor 5950 closely tracks the output corresponding to a HIGH logic state of the voltage controlled differential inverting delay cell 4500-1. As a consequence, operation of the voltage controlled differential inverting delay cell 4500'-1 is substantially the same as that of the prior art voltage controlled differential inverting delay cell 450-1, while the output loading of the voltage controlled differential inverting delay cell 4500'-1 is substantially less than that of the prior art voltage controlled differential inverting delay cell 450-1 and as a consequence, a VCO such as VCO 2000 in FIG. 11 or VCO 2000' in FIG. 12, employing such voltage controlled differential inverting delay cells as the voltage controlled differential inverting delay cell 4500'-1 may operate at a significantly higher frequency than a VCO such as VCO 400 in FIG. 5 or VCO 500 in FIG. 6, employing such voltage controlled differential inverting delay cells as the prior art voltage controlled differential inverting delay cell 450-1.

Although the various aspects of the present invention have been described with respect to a preferred embodiment, it will be understood that the invention is entitled to full protection within the full scope of the appended claims.

What is claimed is:

1. A voltage controlled oscillator circuit comprising:

a plurality of voltage controlled differential delay cells connected together to form a ring oscillator, individual ones of said plurality of voltage controlled differential delay cells having a power node, first and second pluralities of transistors connected to said power node, and a clipper transistor connected to said first and second pluralities of transistors, wherein said power node is connected to a control voltage, said first and second pluralities of transistors define first and second outputs such that each of said first plurality of transistors is turned on and each of said second plurality of transistors is turned off when generating first and second logic states respectively at said first and second outputs, and each of said second plurality of transistors is turned on and each of said first plurality of transistors is turned off when generating said second and first logic states respectively at said first and second outputs, and said clipper transistor has a gate, a drain, and a source, said drain and source connected respectively to said first and second outputs; and a biasing circuit connected to said control voltage and said individual ones of said plurality of voltage controlled differential delay cells, for providing a voltage to said gate of said clipper transistor of said individual ones of said plurality of voltage controlled differential delay cells, said biasing circuit including a third plurality of transistors connected together and individually having substantially the same operating characteristics as a corresponding one of said first plurality of transistors and said clipper transistor so that said voltage provided to said gate of said clipper transistor of said individual ones of said voltage controlled differential delay cells increases as said control voltage increases and decreases as said control voltage decreases.

2. The voltage controlled oscillator circuit as recited in claim 1, wherein said first plurality of transistors have substantially the same operating characteristics as corresponding ones of said second plurality of transistors.

3. The voltage controlled oscillator circuit as recited in claim 1, wherein said first plurality of transistors comprises a first transistor having a source, a drain, and a gate, and a second transistor having a source, a drain, and a gate, and said second plurality of transistors comprises a third transistor having a source, a drain, and a gate, and a fourth transistor having a source, a drain, and a gate, wherein said drains of said first and fourth transistors are connected to the drain of said clipper transistor to form said first output, and said drains of said third and second transistors are connected to the source of said clipper transistor to form said second output.

4. The voltage controlled oscillator circuit as recited in claim 3, wherein the sources of said first and third transistors are connected together, and the sources of said fourth and second transistors are connected together.

5. The voltage controlled oscillator circuit as recited in claim 4, wherein the gates of said first and third transistors respectively receive second and first input voltages, the gate of said second transistor is connected to the drain of said fourth transistor, and the gate of said fourth transistor is connected to the drain of said second transistor.

6. The voltage controlled oscillator circuit as recited in claim 5, wherein said third plurality of transistors of said biasing circuit comprises:

a fifth transistor having a source, a drain, and a gate, said fifth transistor having substantially identical characteristics as said first transistor;

a sixth transistor having a source, a drain, and a gate, said sixth transistor having substantially identical characteristics as said clipper transistor, said drains of said fifth and sixth transistors connected together to provide said voltage to said gate of said clipper transistor of said individual ones of said plurality of voltage controlled delay cells; and a seventh transistor having a source, a drain, and a gate, said seventh transistor having substantially identical characteristics as said second transistor, said source of said sixth transistor connected to said drain of said seventh transistor and to said gate of said fifth transistor, and said gates of said sixth and seventh transistors connected together and to said connected together drains of said fifth and sixth transistors.

7. The voltage controlled oscillator circuit as recited in claim 6, wherein said first, third, and fifth transistors are p-mos transistors having substantially identical characteristics, said clipper and sixth transistors are n-mos transistors having substantially identical characteristics, and said second, fourth, and seventh transistors are n-mos transistors having substantially identical characteristics.

8. The voltage controlled oscillator circuit as recited in claim 7, wherein said connected together sources of said first and third transistors define said power node and receive said control voltage, said connected together sources of said second and fourth transistors are connected to a low reference voltage, said source of said fifth transistor is connected to said control voltage, and said source of said seventh transistor is connected to said low reference voltage.

9. The voltage controlled oscillator circuit as recited in claim 7, wherein said connected together sources of said first and third transistors define said power node and receive a high reference voltage, said connected together sources of said second and fourth transistors are connected to said control voltage, said source of said fifth transistor is connected to said high reference voltage, and said source of said seventh transistor is connected to said control voltage.

10. The voltage controlled oscillator circuit as recited in claim 6, wherein said first, third, and fifth transistors are n-mos transistors having substantially identical characteristics, said clipper and sixth transistors are p-mos transistors having substantially identical characteristics, and said second, fourth, and seventh transistors are p-mos transistors having substantially identical characteristics.

11. The voltage controlled oscillator circuit as recited in claim 10, wherein said connected together sources of said first and third transistors define said power node and receive said control voltage, said connected together sources of said second and fourth transistors are connected to a high reference voltage, said source of said fifth transistor is connected to said control voltage, and said source of said seventh transistor is connected to said high reference voltage.

12. The voltage controlled oscillator circuit as recited in claim 10, wherein said connected together sources of said first and third transistors define said power node and receive a low reference voltage, said connected together sources of said second and fourth transistors are connected to said control voltage, said source of said fifth transistor is connected to said low reference voltage, and said source of said seventh transistor is connected to said control voltage.

13. The voltage controlled oscillator circuit as recited in claim 1, further comprising a source-follower transistor having a source, a drain, and a gate, wherein said drain of said source-follower transistor is connected to a reference voltage, and said source of said source-follower transistor provides said control voltage by following a voltage provided to said gate of said source-follower transistor.

14. The voltage controlled oscillator circuit as recited in claim 13, wherein said source-follower transistor is an n-mos transistor, and said reference voltage is a high reference voltage.

15. The voltage controlled oscillator circuit as recited in claim 13, wherein said source-follower transistor is a p-mos transistor, and said reference voltage is a low reference voltage.

16. A computer system comprising:

a host processor; and a peripheral controller connected to said host processor and including a voltage controlled oscillator having a plurality of voltage controlled differential delay cells connected together to form a ring oscillator, individual ones of said plurality of voltage controlled differential delay cells having a power node, first and second pluralities of transistors connected to said power node, and a clipper transistor connected to said first and second pluralities of transistors, wherein said power node is connected to a control voltage, said first and second pluralities of transistors define first and second outputs such that each of said first plurality of transistors is turned on and each of said second plurality of transistors is turned off when generating first and second logic states respectively at said first and second outputs, and each of said second plurality of transistors is turned on and each of said first plurality of transistors is turned off when generating said second and first logic states respectively at said first and second outputs, and said clipper transistor has a gate, a drain, and a source, said drain and source connected respectively to said first and second outputs; and a biasing circuit connected to said control voltage and said individual ones of said plurality of voltage controlled differential delay cells, for providing a voltage to said gate of said clipper transistor of said individual ones of said plurality of voltage controlled differential delay cells, said biasing circuit including a third plurality of transistors connected together and individually having substantially the same operating characteristics as a corresponding one of said first plurality of transistors or said clipper transistor so that said voltage provided to said gate of said clipper transistor of said individual ones of said voltage controlled differential delay cells increases as said control voltage increases and decreases as said control voltage decreases.

17. The computer system as recited in claim 16, wherein said first plurality of transistors of said voltage controlled oscillator circuit have substantially the same operating characteristics as corresponding ones of said second plurality of transistors of said voltage controlled oscillator circuit.

18. The computer system as recited in claim 16, wherein said first plurality of transistors of said voltage controlled oscillator circuit comprises a first transistor having a source, a drain, and a gate, and a second transistor having a source, a drain, and a gate, and said second plurality of transistors of said voltage controlled oscillator circuit comprises a third transistor having a source, a drain, and a gate, and a fourth transistor having a source, a drain, and a gate, wherein said drains of said first and fourth transistors are connected to the drain of said clipper transistor to form said first output, and said drains of said third and second transistors are connected to the source of said clipper transistor to form said second output.

19. The computer system as recited in claim 18, wherein the sources of said first and third transistors are connected together, the sources of said fourth and second transistors are connected together, the gates of said first and third transistors respectively receive second and first input voltages, the gate of said second transistor is connected to the drain of said fourth transistor, and the gate of said fourth transistor is connected to the drain of said second transistor.

20. The computer system as recited in claim 18, wherein said voltage controlled oscillator circuit further includes a source-follower transistor having a source, a drain, and a gate, said drain of said source-follower transistor being connected to a reference voltage, and said source of said source-follower transistor providing said control voltage by following a voltage provided to said gate of said source-follower transistor.

* * * * *